US006925616B2

(12) United States Patent
Noujeim et al.

(10) Patent No.: US 6,925,616 B2
(45) Date of Patent: Aug. 2, 2005

(54) METHOD TO TEST POWER DISTRIBUTION SYSTEM

(75) Inventors: Leesa Noujeim, Sunnyvale, CA (US); Bidyut K. Sen, Milpitas, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 330 days.

(21) Appl. No.: 10/265,035

(22) Filed: Oct. 4, 2002

(65) Prior Publication Data

US 2004/0068700 A1 Apr. 8, 2004

(51) Int. Cl.[7] .................. G06F 17/50; G01R 13/02; G01R 31/08
(52) U.S. Cl. ................ 716/4; 716/5; 716/18; 324/76.55; 324/512; 324/645; 438/14; 438/484
(58) Field of Search ............... 716/4, 5, 15, 18; 714/733, 731; 704/204; 703/2; 438/484, 14; 370/320; 345/723; 331/134; 324/765, 645, 509; 323/234

(56) References Cited

U.S. PATENT DOCUMENTS

| | | | |
|---|---|---|---|
| 3,975,679 A | * 8/1976 | Weinert et al. | 324/645 |
| 5,491,442 A | 2/1996 | Mirov et al. | 327/295 |
| 5,539,328 A | 7/1996 | Mirov et al. | 326/30 |
| 5,623,418 A | 4/1997 | Rostoker et al. | 364/489 |
| 5,640,537 A | 6/1997 | Jessen et al. | 395/500 |
| 5,790,890 A | 8/1998 | Mirov et al. | 395/835 |
| 5,801,958 A | 9/1998 | Dangelo et al. | 364/489 |
| 5,931,962 A | 8/1999 | Dang | 714/731 |
| 5,952,863 A | 9/1999 | Jones et al. | 327/295 |
| 6,008,682 A | 12/1999 | Mirov | 327/333 |
| 6,011,383 A | 1/2000 | Dean et al. | 323/234 |
| 6,138,236 A | 10/2000 | Mirov et al. | 713/200 |
| 6,360,353 B1 | 3/2002 | Pember et al. | 716/4 |
| 6,493,853 B1 | * 12/2002 | Savithri et al. | 716/5 |
| 6,499,131 B1 | * 12/2002 | Savithri et al. | 716/5 |
| 6,546,528 B1 | * 4/2003 | Sasaki et al. | 716/5 |
| 6,671,842 B1 | * 12/2003 | Phan et al. | 714/733 |
| 6,720,194 B1 | * 4/2004 | Miller et al. | 438/14 |
| 2003/0143821 A1 | * 7/2003 | Niino et al. | 438/484 |
| 2003/0189907 A1 | * 10/2003 | Miyamoto et al. | 370/320 |

OTHER PUBLICATIONS

Mandhana et al., "Modeling, analysis and design of resonant free power distribution network for modern microprocessor system", Feb. 2004, IEEE Transactions see also Components, Packaging and Manufacturing Technology, Part B, vol.: 2 Issue1, pp.: 107.*

IBM Technical Disclosure Bulletin, "Voltage Planes on a Multilayer Board", vol. No.: 22, Jan. 1980, US, vol. No.: 22, Issue No.: 8A, p. No. 3219–3222.*

Fechser et al., "A methodology for debugging ASIC prototypes in the field", Dec. 1991, Design & Test of Computers, IEEE, vol.: 8 , Issue: 4 , pp.: 18–23.*

Allmon et al., "System, process, and design implications of a reduced supply voltage microprocessor", Feb. 14–16, 1990 , Solid State Circuits Conference, 1990. Digest of Technical Papers. 37th ISSCC., 1990 IEEE International , pp.: 48–49, 263.*

Arnett et al., "High speed power system for Josephson logic", Sep. 1980, Magnetics, IEEE Transactions on , vol. 16 , Issue: 5 ,pp.: 1233–1235.*

* cited by examiner

Primary Examiner—A. M. Thompson
Assistant Examiner—Helen Rossoshek
(74) Attorney, Agent, or Firm—Hamilton & Terrile, LLP; Stephen A. Terrile

(57) ABSTRACT

A method for testing a core power distribution system for an integrated circuit chip which includes arranging a plurality of experiments for an integrated circuit chip, performing the plurality of experiments for the integrated circuit chip over a range of frequencies over a range of power distribution system impedances, generating a schmoo diagram for each of the plurality of experiments, and analyzing the schmoo diagrams to determine whether the core power distribution system functions is acceptable at a particular frequency.

17 Claims, 10 Drawing Sheets

METHOD TO TEST POWER DISTRIBUTION SYSTEM

BACKGROUND OF THE INVENTION

1. Field of the Invention

The present invention relates to the field of integrated circuit chips including the integrated circuit chip package and more particularly to testing power distribution systems for integrated circuit chips including the integrated circuit chip package.

2. Description of the Related Art

When designing integrated circuit chips, one area of importance is the design of a core power distribution that delivers power to the integrated circuit chip (for the purposes of this disclosure, the use of the term integrated circuit chip includes a corresponding integrated circuit chip package). It is important to provide power to the integrated circuit chip via enough pins that the impedance of the core power distribution is not an issue for the performance of the integrated circuit. However, designing a core power distribution system with too many pins provides its own set of challenges. The pins are expensive to manufacture. Also, and the more pins, the greater the insertion force required to insert the integrated circuit chip into a respective socket. Also, a large number of pins also increases the manufacturing complexity of both the integrated circuit and the integrated circuit socket. Accordingly, it is desirable to have the fewest number of pins associated with the core power distribution system that does not effect the performance of the integrated circuit.

However, it is often difficult to assess the effectiveness of a core power distribution system that delivers power to an integrated circuit chip such as a processor. Direct measurement of voltage excursions on a die is possible but difficult. It is unclear whether the observed excursions are tolerable.

It is known to perform schmoos on core voltage and operating frequency for a system. A schmoo plot is a plot of symbols indicating a result over a range of operating conditions such as core voltage and requency.

SUMMARY OF THE INVENTION

In accordance with the present invention, a method for quantifying the effectiveness of a core power distribution system in terms of how the system behavior changes as the core power distribution system changes is set forth. Such a method provides a better understanding of power distribution effectiveness of current integrated circuit chip designs and more confidence when designing power distribution within an integrated circuit chip.

In one embodiment, the invention relates to a method for testing a core power distribution system for an integrated circuit chip which includes arranging a plurality of experiments for an integrated circuit chip, performing the plurality of experiments for the integrated circuit chip over a range of frequencies over a range of power distribution system impedances, generating a schmoo diagram for each of the plurality of experiments, and analyzing the schmoo diagrams to determine whether the core power distribution system functions are acceptable at a particular frequency.

In another embodiment, the invention relates to a system for testing a core power distribution system for an integrated circuit chip which includes means for arranging a plurality of experiments for an integrated circuit chip, means for performing the plurality of experiments for the integrated circuit chip over a range of frequencies over a range of power distribution system impedances, means for generating a schmoo diagram for each of the plurality of experiments, and means for analyzing the schmoo diagrams to determine whether the core power distribution system functions are acceptable at a particular frequency.

In another embodiment, the invention relates to an apparatus for testing a core power distribution system for an integrated circuit chip via a plurality of experiments including progressively depopulating power and ground connections of the integrated circuit chip. The apparatus includes means for performing the plurality of experiments for the integrated circuit chip over a range of frequencies over a range of power distribution system impedances, means for generating a schmoo diagram for each of the plurality of experiments, and means for analyzing the schmoo diagrams to determine whether the core power distribution system functions are acceptable at a particular frequency.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
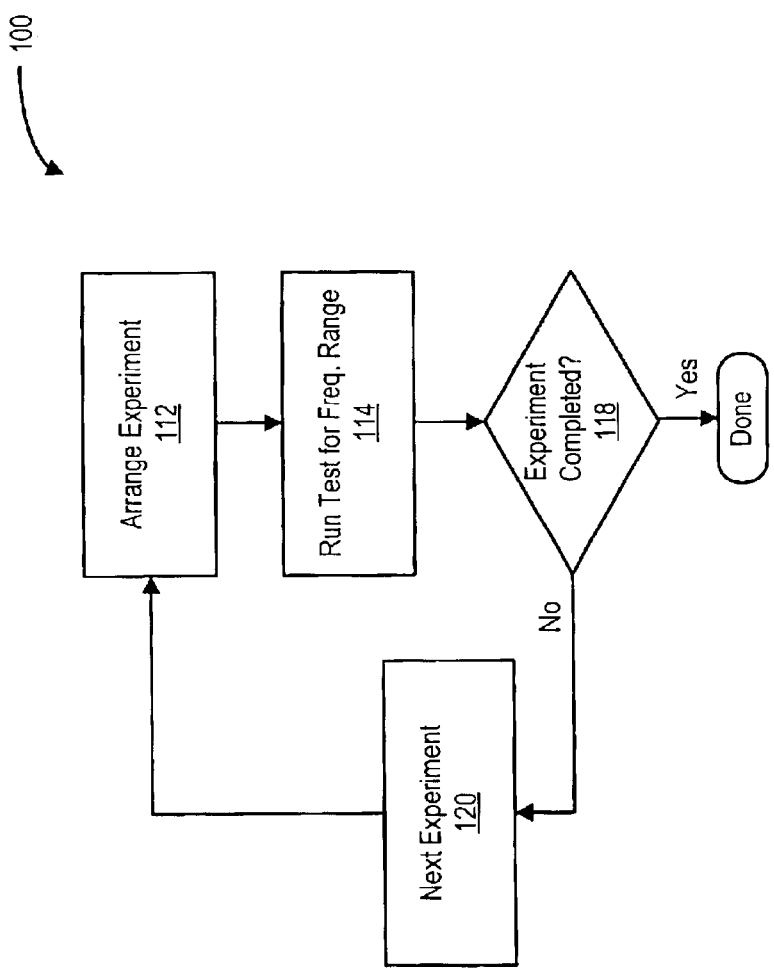
FIG. 1 shows a flow chart of a method for testing the effect of socket impedance on integrated circuit frequency.

Referring to FIG. 1, a flow chart of a method for testing the socket impedance on an integrated circuit maximum frequency is shown. The testing method 100 studies the behavior of a computer system as an integrated circuit socket is modified across a frequency range. More specifically, the test quantifies repeatability of results for a plurality of experiments on an integrated circuit socket including when the integrated circuit socket is depopulated, replaced and/or reseated.

The method starts by arranging the experiment to be performed on the integrated circuit socket at step 112. After the experiment is arranged, then the test is executed for a prescribed frequency range at step 114. Each repetition of the test provides a respective line for a schmoo plot. In addition to the schmoo plot line, each test generates an output listing file which includes all messages sent to and from the system under test, including failure reports.

After the second test is completed, then the method reviews the experiments performed to determine whether any other experiments are to be performed at step 118. If all of the experiments have not been completed, then the method provides an indication to perform the next experiment at step 120 and the next experiment is arranged at step 112. The experiments test the sensitivity of schmoo results to module seating, socket seating, socket sensitivity and particular socket depopulation patterns. The socket tests include reseating the integrated circuit, reseating the integrated circuit module and replacing the actual integrated circuit module.

More specifically, the test performed in one embodiment are set forth in Table 1.

TABLE 1

Test sensitivity to module seating.
    (1) Original system setup
    (2) Reseat module0
    (3) Reseat module0
Test sensitivity to socket seating (including reseating module).
    (4) Reseat cpu0 and socket0; Reseat module0
    (5) Reseat cpu0 and socket0; Reseat module0
    (6) Reseat cpu0 and socket0; Reseat module0
Test sensitivity to socket (including reseating socket, cpu and module).
    (7) Replace socket0 with socket1. Reseat cpu0, Reseat module0
    (8) Replace socket1 with socket2. Reseat cpu0, Reseat module0
    (9) Replace socket2 with socket3. Reseat cpu0, Reseat module0
Test sensitivity to socket depop pattern a1 (including reseating cpu and module).
    (10) Replace socket3 with socket1_a1. Reseat cpu0, Reseat module0
    (11) Replace socket1_a1 with socket2_a1. Reseat cpu0, Reseat module0
    (12) Replace socket2_a1 with socket3_a1. Reseat cpu0, Reseat module0
    (13) Replace socket3_a1 with socket1_a1. Reseat cpu0, Reseat module0
    (14) Replace socket1_a1 with socket2_a1. Reseat cpu0, Reseat module0
    (15) Replace socket2_a1 with socket3_a1. Reseat cpu0, Reseat module0
Test sensitivity to socket depop pattern a2 (including reseating cpu and module).
    (16) Replace socket3_a1 with socket1_a2. Reseat cpu0, Reseat module0
    (17) Replace socket1_a2 with socket2_a2. Reseat cpu0, Reseat module0
    (18) Replace socket2_a2 with socket3_a2. Reseat cpu0, Reseat module0
    (19) Replace socket3_a2 with socket1_a2. Reseat cpu0, Reseat module0
    (20) Replace socket1_a2 with socket2_a2. Reseat cpu0, Reseat module0
    (21) Replace socket2_a2 with socket3_a2. Reseat cpu0, Reseat module0
Test sensitivity to socket depop pattern a3 (including reseating cpu and module).
    (16) Replace socket3_a2 with socket1_a3. Reseat cpu0, Reseat module0
    (17) Replace socket1_a3 with socket2_a3. Reseat cpu0, Reseat module0
    (18) Replace socket2_a3 with socket3_a3. Reseat cpu0, Reseat module0
    (19) Replace socket3_a3 with socket1_a3. Reseat cpu0, Reseat module0
    (20) Replace socket1_a3 with socket2_a3. Reseat cpu0, Reseat module0
    (21) Replace socket2_a3 with socket3_a3. Reseat cpu0, Reseat module0

In these tests, the "socketx" nomenclature corresponds to a socket number. The "socketx_ay" nomenclature corresponds to a socket number having a particular depopulation pattern.

Figure 2:
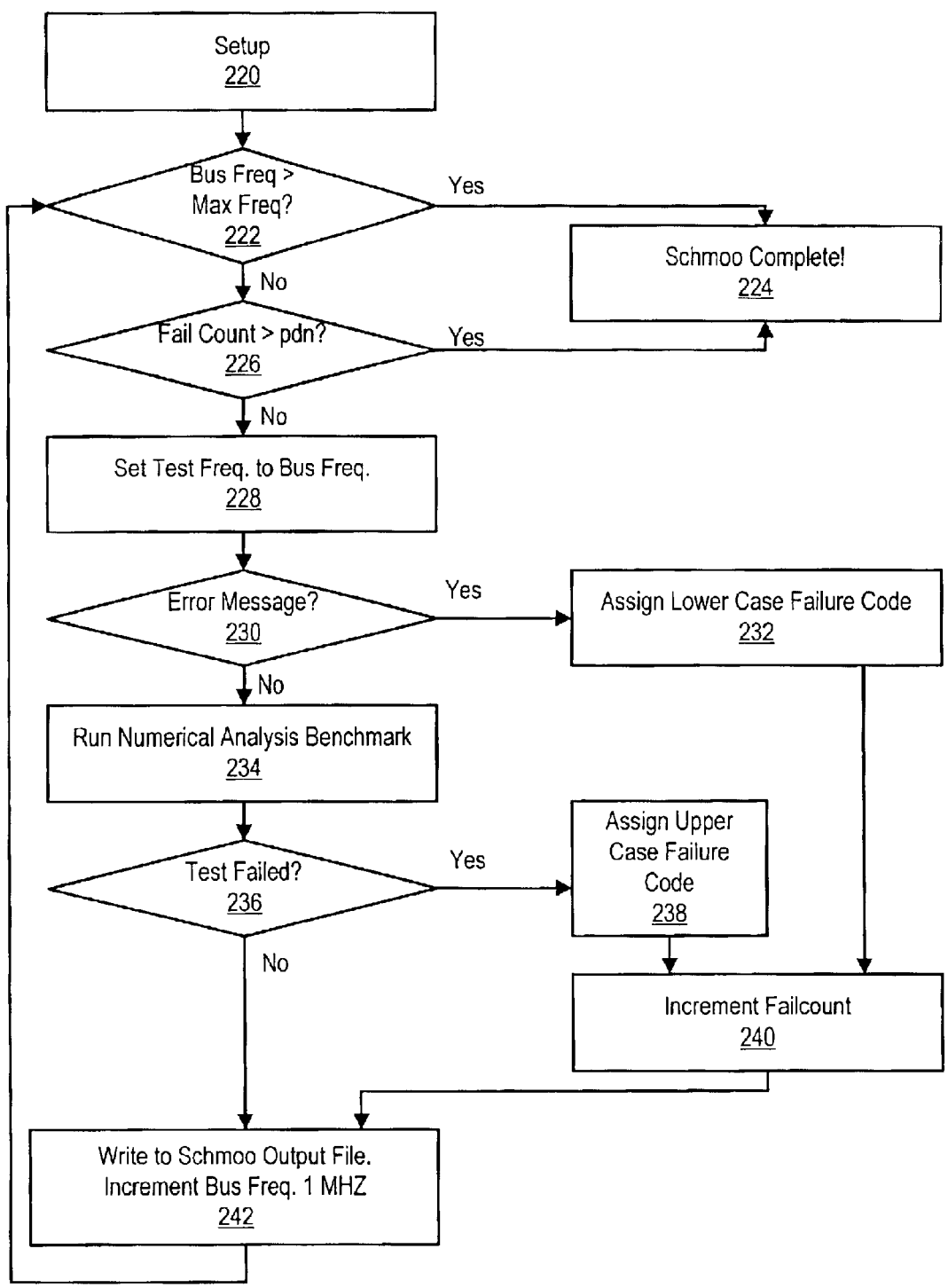
FIG. 2 shows a flow chart of the method for testing an integrated circuit over a frequency range for the FIG. 1 method for testing the effect of socket impedance.

Referring to FIG. 2, a flow chart of the test for a prescribed frequency range 114 is shown. More specifically, the test is setup at setup step 220. During the setup, the bus frequency is set to a start frequency. In one embodiment, the start frequency is 150 MHz. Also, the schmoo output file is setup during the setup step 220 and the fail count is initialized to zero during the setup step 220. The bus frequency is reviewed to determine whether the bus frequency is greater than the maximum frequency for the test at step 222. If the bus frequency is greater than the maximum frequency for the test, then the schmoo is complete as indicated by step 224 and control returns to the method for testing the socket impedance 100.

If the bus frequency is not greater than the maximum frequency, then the fail count is reviewed to determine whether the fail count is greater than a predetermined number (pdn) (e.g., 10). If the fail count is greater than 10, then the schmoo is complete as indicated by step 224 and control returns to the method for testing the socket impedance 100. In will be appreciated that the number used for the fail count may be any number, this number simply reflects the number of iterations of the frequency range test, and thus how many different frequencies are tested.

Next the test frequency is set to the bus frequency at step 228. After the test frequency is set to the bus frequency then the system under test output stream is reviewed to determine whether an error message is present at step 230. If an error message is present, then a lower case failure code is assigned to the particular schmoo location at assign step 232. If an error message is not present then a numerical analysis benchmark is executed to determine whether the integrated circuit operating properly at the present test frequency. A lower case error code indicates that the system under test issued an error code.

After the test is executed, then the test results are analyzed at step 236 to determine whether the test failed. If the test failed, then an upper case failure code is assigned to the particular schmoo location at step 238. An upper case failure code indicates that the system under test failed at a particular frequency. Whether a lower case failure code is assigned during step 232 or an upper case failure code is assigned during step 238, the fail count is incremented at step 240.

If the test passed, then a pass code is written to the schmoo output file at step 242. Alternately, after the fail count is incremented at step 240, then the appropriate pass or failure code is written to the schmoo output file at step 242. Next the bus frequency is incremented at step 244 and control returns to step 222.

Referring to FIGS. 3A–3D, a plurality of integrated circuit power and ground pin population patterns are shown. In each of these figures, an "X" indicates a power (e.g., vdd) pin and a "O" indicates a ground (e.g., vss) pin. The patterns shown in FIGS. 3A–3D represent the power and ground pins. Signal and I/O power and ground pins surround the core power and ground pins on a socket. However, these pins are not shown because these pins are not depopulated. The removal of any of the signal may affect the integrity of the actual operation of the integrated circuit.

Figure 3B:
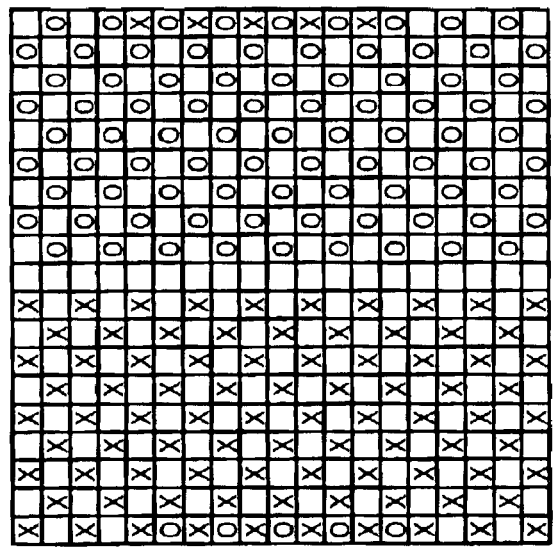
FIGS. 3A–3D (generally referred to as FIG. 3) show a sequence of depopulation patterns for an integrated circuit socket.
Figure 3A:
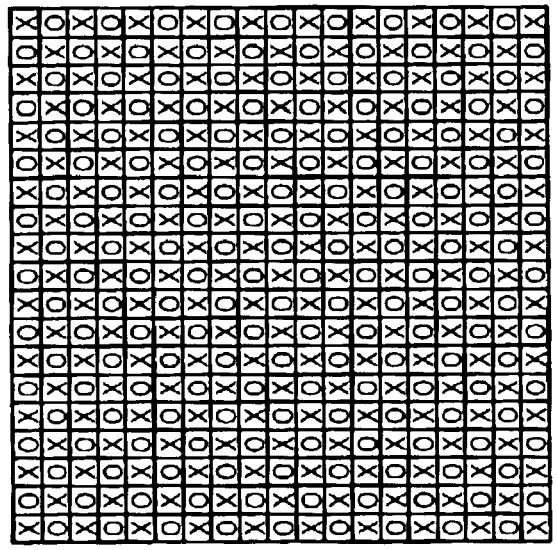
Figure 3D:
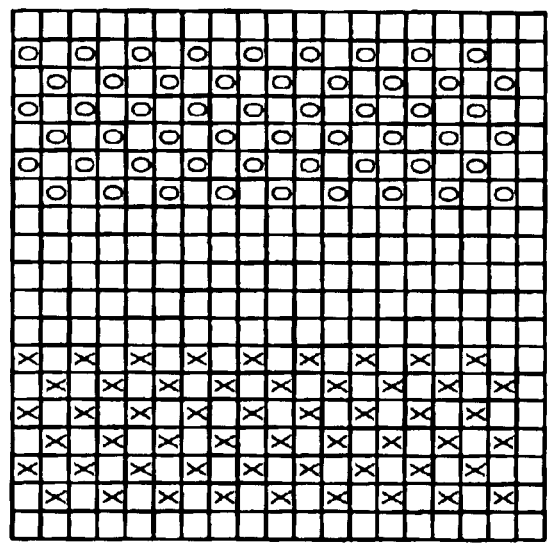
Figure 3C:
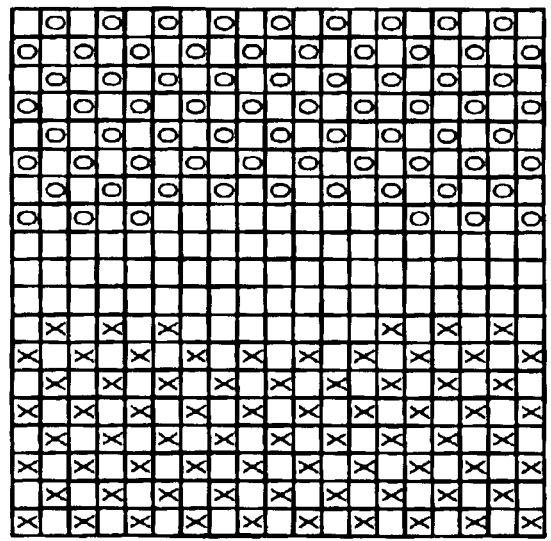

More specifically, FIG. 3A sets forth a fully populated integrated circuit socket. FIGS. 3B–3D show progressively more depopulated sockets where the depopulation follows a progressively more separate layout. The depopulation sequence shown in FIG. 3 aims to increase inductance rapidly across the sequence by removing power pins from one side of an array and ground pins from the other side of the array. Thus this depopulation sequence dismantles the checkerboard power/ground arrangement set forth in FIG. 3A.

Figure 4B:
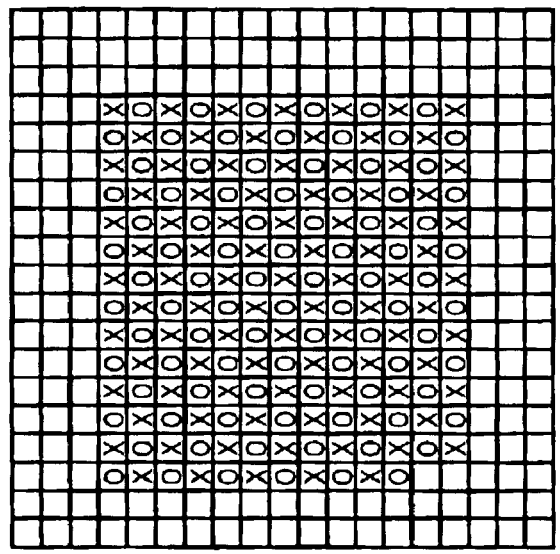
FIGS. 4A–4D (generally referred to as FIG. 4) show another sequence of depopulation patterns for an integrated circuit socket.
Figure 4A:
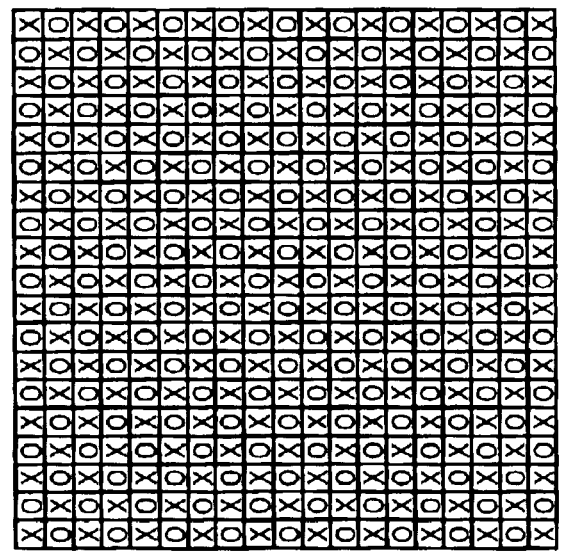
Figure 4D:
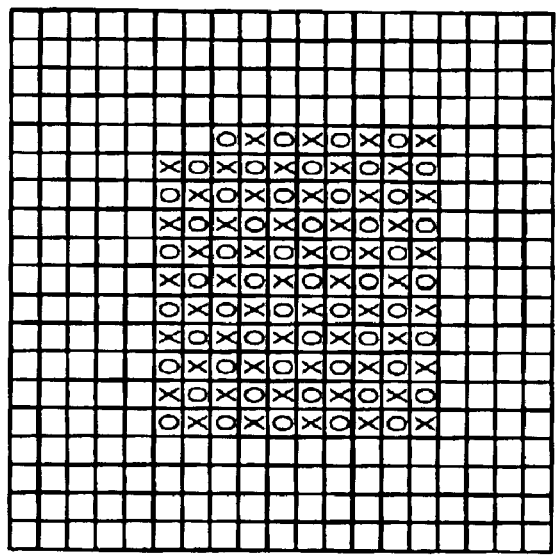
Figure 4C:
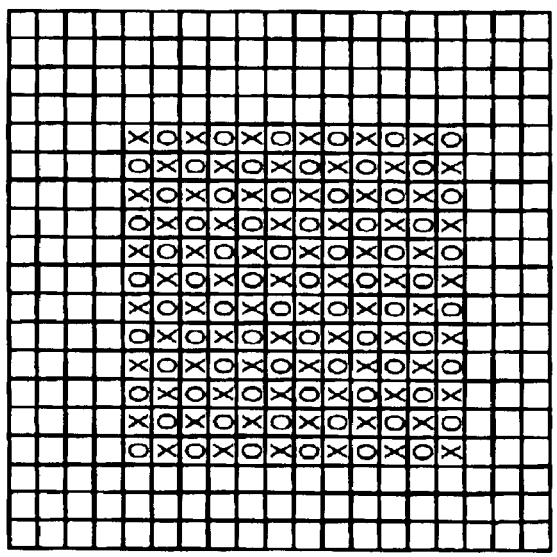

FIGS. 4A–4D show another depopulation sequence. More specifically, FIG. 4A sets forth a fully populated integrated circuit socket. FIGS. 4B–4D show progressive mode depopulated sockets where the depopulation follows a progressively more centered layout. The depopulation sequence shown in FIG. 4 aims to increase inductance less rapidly than the FIG. 3 depopulation sequence by removing pins from the perimeter of the array, leaving the checkerboard pattern intact in the center of the socket.

Figure 5B:
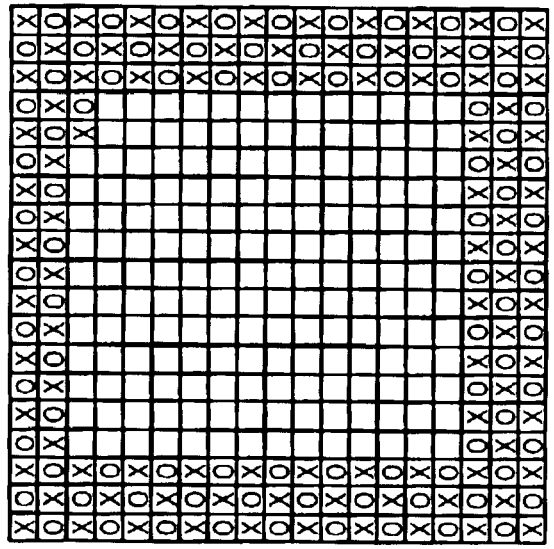
FIGS. 5A–5D (generally referred to as FIG. 5) show another sequence of depopulation patterns for an integrated circuit socket.
Figure 5A:
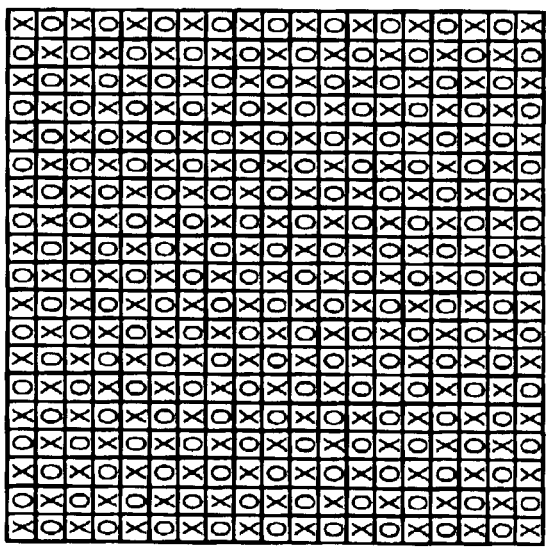
Figure 5D:
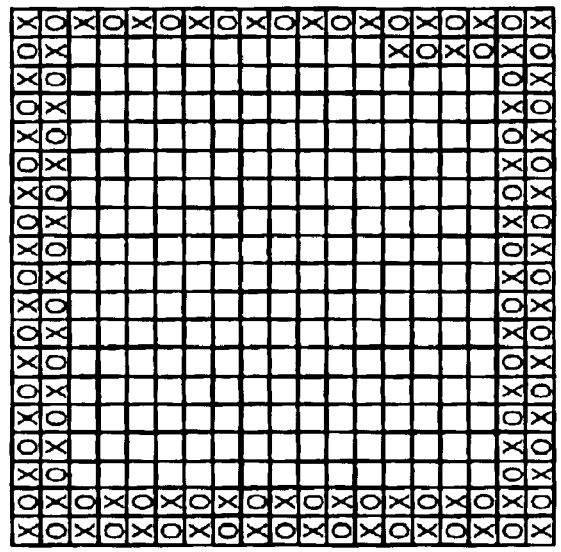
Figure 5C:
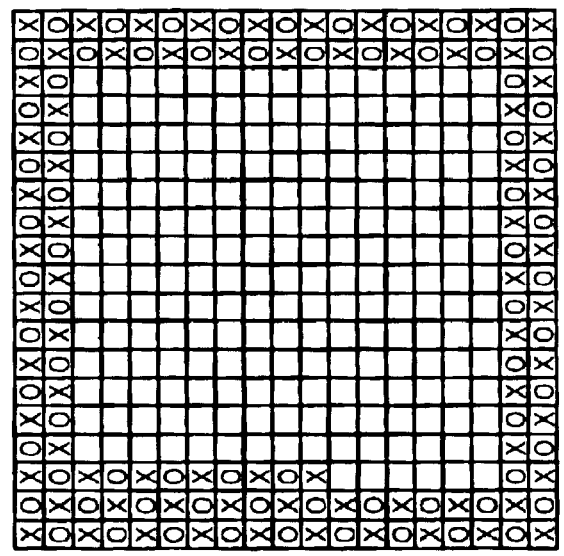

FIGS. 5A–5D show another depopulation sequence. More specifically, FIG. 5A sets forth a fully populated integrated circuit socket. FIGS. 5B–5D show progressive mode depopulated sockets where the depopulation follows a progressively more perimeter oriented layout. The depopulation sequence shown in FIG. 5 aims to increase inductance less rapidly than the FIG. 3 depopulation sequence by removing pins from the center of the array, leaving the checkerboard pattern intact around the perimeter of the array.

Figure 6:
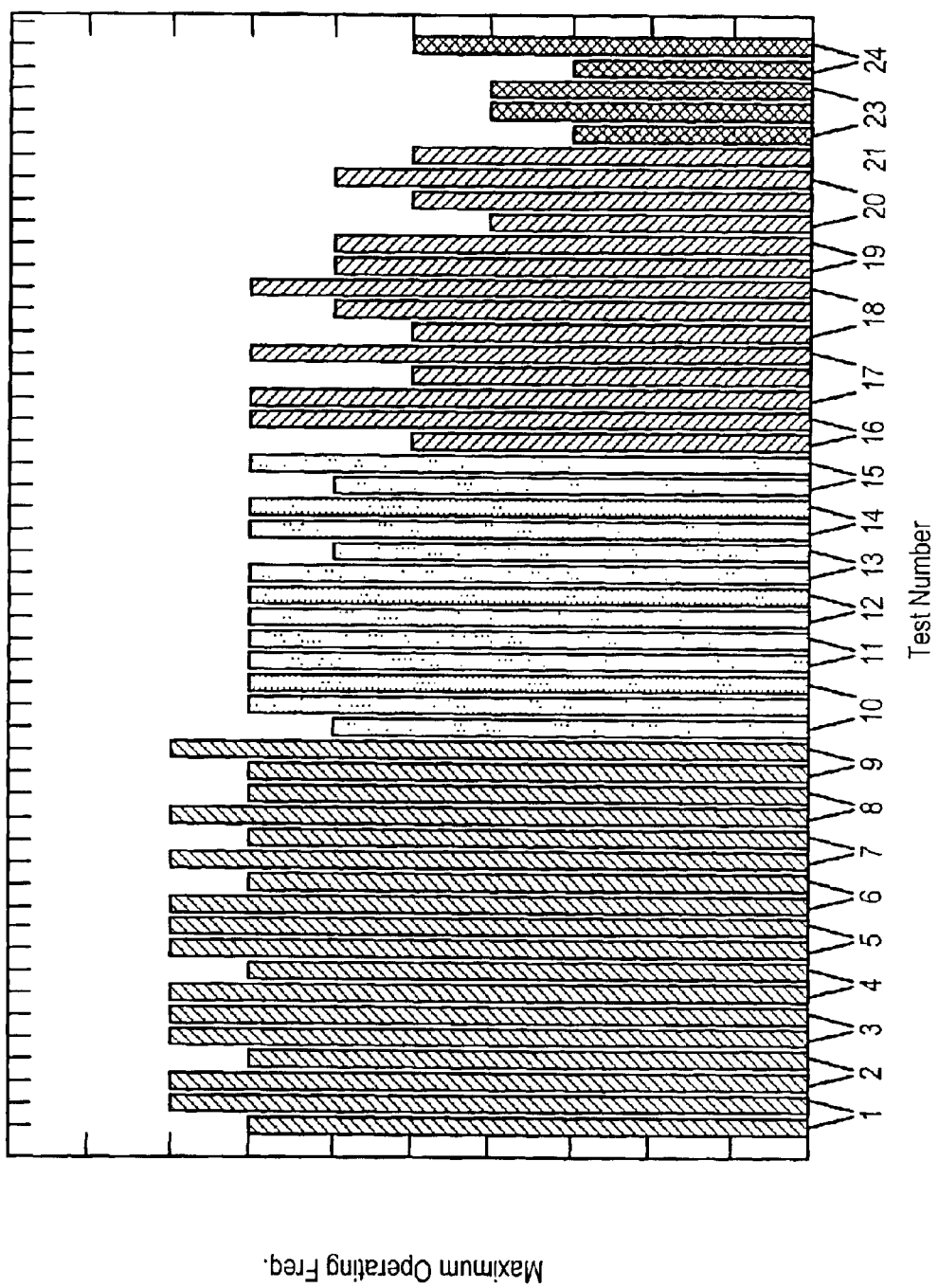
FIG. 6 shows a maximum operating frequency sample output of the method for testing the socket impedance on an integrated circuit.

Referring to FIG. 6, the maximum operating frequency observed in each cycle is shown. The maximum operating frequency corresponds to one frequency step below the frequency at which a first failure was observed.

Most of the tests set forth in FIG. 6 have two values (i.e., two bars) which correspond to the two frequency cycles in each schmoo. Some tests were repeated, e.g., test number 17, and thus have more than two bars.

Table 2 sets forth sample schmoo results for tests performed in one embodiment according to the tests set forth in Table 1. Note that some of the tests set forth in Table 1 were not performed on the integrated circuit and thus no results are present for these tests.

TABLE 2

| | Test 1 | ****************D*D |
| --- | --- | --- |
| Sensitivity to Module Seating | | ****************Dt |
| | Test 2 | ****************D* |
| | | ****************D*D |
| | Test 3 | ****************Dt |
| | | ****************D* |
| Sensitivity to Socket Seating | Test 4 | ****************t* |
| | | ****************D*D |
| | Test 5 | ****************D* |
| | | ****************F* |
| | Test 6 | ****************Dt |
| | | ****************D*D |
| Sensitivity to Socket | Test 7 | ****************D* |
| | | ****************Dt* |
| | Test 8 | ****************D. |
| | | ****************D*t |
| | Test 9 | ****************D*D |
| | | ****************D* |
| Sensitivity to Depopulation Pattern a1 | Test 10 | ****************D*D |
| | | ****************D*D |
| | | ****************D*D |
| | Test 11 | ****************D*D |
| | | ****************ttt |
| | Test 12 | ****************Dt* |
| | | ****************DtF |
| | Test 13 | ****************F*D |
| | | ****************D*Dt |
| | Test 14 | ****************ttt |
| | | ****************Dtt |
| | Test 15 | ****************D*T. |
| | | ****************D*D |
| Sensitivity to Depopulation Pattern a2 | Test 16 | **************DDF |
| | | ****************D*D |
| | Test 17 | ****************Dtt |
| | | **************tDt |
| | | ****************t*D |
| | Test 18 | ****************t*ttt |
| | | ****************te |
| | | ****************D*D |
| | | **************DD |

TABLE 2-continued

| | Test 19 | ****************tt*D |
| --- | --- | --- |
| | | ****************Dttt |
| | Test 20 | **************tt*D |
| | | ****************t*D |
| | | ****************t |
| | Test 21 | ****************t |
| Sensitivity to Depopulation Pattern a3 | Test 23 | **************tD |
| | | ****************tttttt |
| | | ****************tDDDDD |
| | Test 24 | **************tD*DF |
| | | ****************Dt*Dt |

Figure 7:
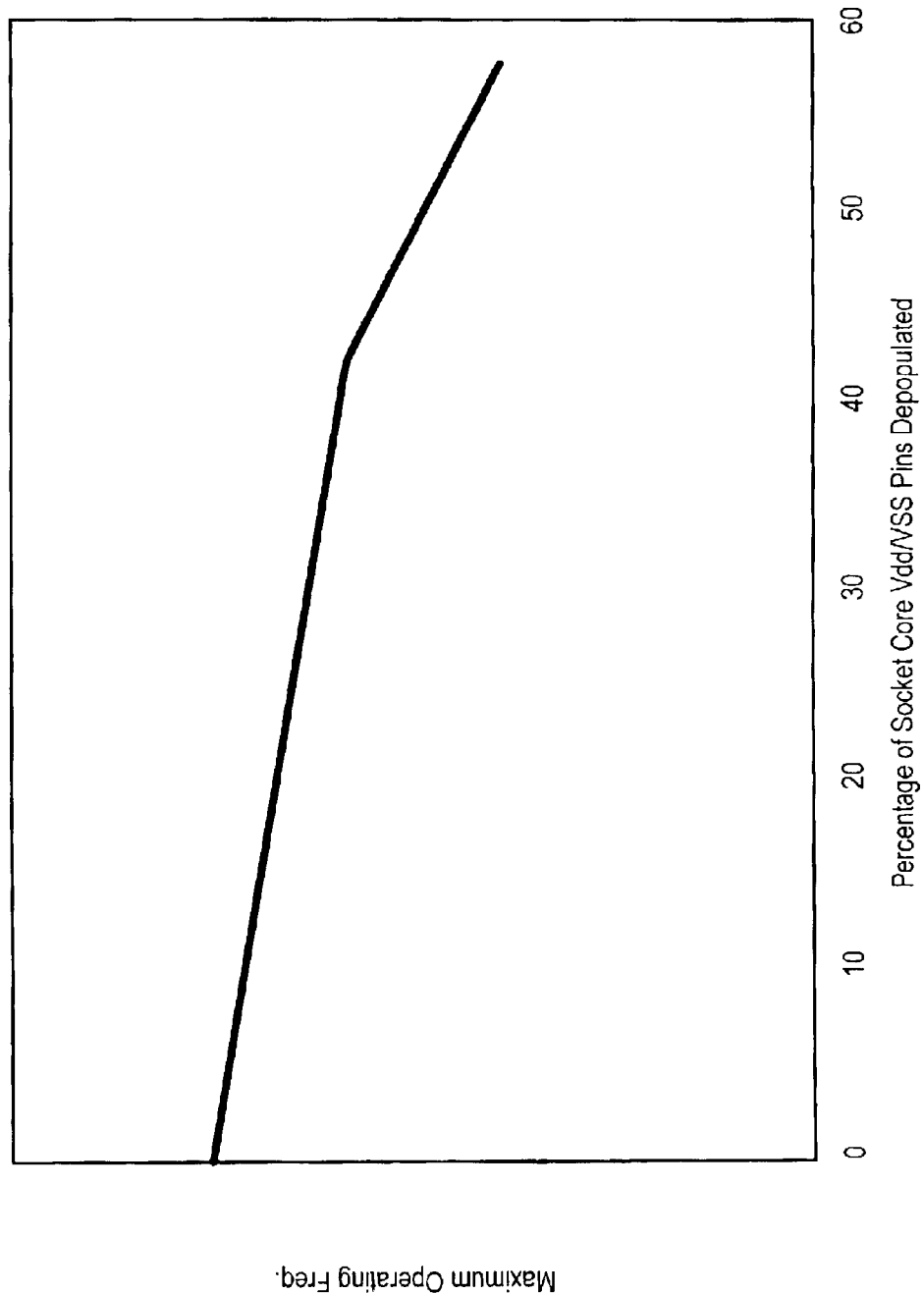
FIG. 7 shows chart representing a synopsis of the screening experiment results of the method for testing the socket impedance on an integrated circuit.

FIG. 7 further summarizes the screening experiment results. Here three metrics are shown for each depopulation pattern: the mean, the maximum observed operating frequency across all of the tests and the minimum observed operating frequency across all of the tests. By using this data, it is possible to identify a socket pin population which meets the functional requirements of the integrated circuit while having certain pin locations of the socket depopulated. The data set forth in FIG. 7 shows that the maximum operating frequency decreases as the socket is depopulated.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method for testing a core power distribution system for an integrated circuit chip comprising:

arranging a plurality of experiments for an integrated circuit chip, the arranging the plurality of experiments for the integrated circuit chip including progressively depopulating pins of the integrated circuit chip;

performing the plurality of experiments for the integrated circuit chip over a range of frequencies over a range of power distribution system impedances;

generating a schmoo diagram for each of the plurality of experiments; and analyzing the schmoo diagrams to determine whether the core power distribution system functions are acceptable at a particular frequency.

2. The method for testing a core power distribution system of claim 1 wherein the progressively depopulating pins includes progressively depopulating pins to generate a progressively more separate layout.

3. The method for testing a core power distribution system of claim 1 wherein the progressively depopulating pins includes progressively depopulating pins to generate a progressively more centered layout.

4. The method for testing a core power distribution system of claim 1 wherein the progressively depopulating pins includes progressively depopulating pins to generate a progressively more perimeter oriented layout.

5. The method for testing a core power distribution system of claim 1 further comprising:

repeating the performing the plurality of experiments for the integrated circuit chip over a range of frequencies over a range of power distribution system impedances;

generating a schmoo diagram for each of the repeated plurality of experiments; and analyzing the schmoo diagrams to determine whether the core power distribution system functions are acceptable at a particular frequency.

6. A method for testing a core power distribution system for an integrated circuit chip comprising:

arranging a plurality of experiments for an integrated circuit chip;

performing the plurality of experiments for the integrated circuit chip over a range of frequencies over a range of power distribution system impedances;

generating a schmoo diagram for each of the plurality of experiments; and analyzing the schmoo diagrams to determine whether the core power distribution system functions are acceptable at a particular frequency;

wherein the arranging a plurality of experiments for an integrated circuit chip includes at least one of replacing an integrated circuit socket with another integrated circuit socket, replacing an integrated circuit chip within an integrated circuit socket, reseating an integrated circuit chip within an integrated circuit socket, reseating an integrated circuit module and depopulating an integrated circuit socket.

7. A system for testing a core power distribution system for an integrated circuit chip comprising:

means for arranging a plurality of experiments for an integrated circuit chip, the means for arranging the plurality of experiments for the integrated circuit chip includes progressively depopulating pins of the integrated circuit chip;

means for performing the plurality of experiments for the integrated circuit chip over a range of frequencies over a range of power distribution system impedances;

means for generating a schmoo diagram for each of the plurality of experiments; and means for analyzing the schmoo diagrams to determine whether the core power distribution system functions are acceptable at a particular frequency.

8. The system for testing a core power distribution system of claim 7 wherein the progressively depopulating pins includes progressively depopulating pins to generate a progressively more separate layout.

9. The system for testing a core power distribution system of claim 7 wherein the progressively depopulating pins includes progressively depopulating pins to generate a progressively more centered layout.

10. The system for testing a core power distribution system of claim 7 wherein the progressively depopulating pins includes progressively depopulating pins to generate a progressively more perimeter oriented layout.

11. The system for testing a core power distribution system of claim 7 further comprising:

means for repeating the performing the plurality of experiments for the integrated circuit chip over a range of frequencies over a range of power distribution system impedances;

means for generating a schmoo diagram for each of the repeated plurality of experiments; and, means for analyzing the schmoo diagrams to determine whether the core power distribution system functions are acceptable at a particular frequency.

12. A system for testing a core power distribution system for an integrated circuit chip comprising:

means for arranging a plurality of experiments for an integrated circuit chip;

means for performing the plurality of experiments for the integrated circuit chip over a range of frequencies over a range of power distribution system impedances;

means for generating a schmoo diagram for each of the plurality of experiments; and means for analyzing the schmoo diagrams to determine whether the core power distribution system functions are acceptable at a particular frequency;

wherein the means for arranging a plurality of experiments for an integrated circuit chip includes at least one of replacing an integrated circuit socket with another integrated circuit socket, replacing an integrated circuit chip within an integrated circuit socket, reseating an integrated circuit chip within an integrated circuit socket, reseating an integrated circuit module and depopulating an integrated circuit socket.

13. An apparatus for testing a core power distribution system for an integrated circuit chip via a plurality of experiments including progressively depopulating power and ground connections of the integrated circuit chip, the apparatus comprising:

means for performing the plurality of experiments for the integrated circuit chip over a range of frequencies over a range of power distribution system impedances;

means for generating a schmoo diagram for each of the plurality of experiments; and means for analyzing the schmoo diagrams to determine whether the core power distribution system functions are acceptable at a particular frequency;

wherein the progressively depopulating pins includes progressively depopulating pins to generate a progressively more separate layout.

14. An apparatus for testing a core power distribution system for an integrated circuit chip via a plurality of experiments including progressively depopulating power and ground connections of the integrated circuit chip, the apparatus comprising:

means for performing the plurality of experiments for the integrated circuit chip over a range of frequencies over a range of power distribution system impedances;

means for generating a schmoo diagram for each of the plurality of experiments; and means for analyzing the schmoo diagrams to determine whether the core power distribution system functions are acceptable at a particular frequency;

wherein the progressively depopulating pins includes progressively depopulating pins to generate a progressively more centered layout.

15. An apparatus for testing a core power distribution system for an integrated circuit chip via a plurality of experiments including progressively depopulating power and ground connections of the integrated circuit chip, the apparatus comprising:

means for performing the plurality of experiments for the integrated circuit chip over a range of frequencies over a range of power distribution system impedances;

means for generating a schmoo diagram for each of the plurality of experiments; and means for analyzing the schmoo diagrams to determine whether the core power distribution system functions are acceptable at a particular frequency;

wherein the progressively depopulating pins includes progressively depopulating pins to generate a progressively more perimeter oriented layout.

16. An apparatus for testing a core power distribution system for an integrated circuit chip via a plurality of experiments including progressively depopulating power and ground connections of the integrated circuit chip, the apparatus comprising:

means for performing the plurality of experiments for the integrated circuit chip over a range of frequencies over a range of power distribution system impedances;

means for generating a schmoo diagram for each of the plurality of experiments; and means for analyzing the schmoo diagrams to determine whether the core power distribution system functions are acceptable at a particular frequency;

wherein the plurality of experiments for an integrated circuit chip include at least one of replacing an integrated circuit socket with another integrated circuit socket, replacing an integrated circuit chip within an integrated circuit socket, reseating an integrated circuit chip within an integrated circuit socket, reseating an integrated circuit module and depopulating an integrated circuit socket.

17. The apparatus for testing a core power distribution system of claim 16 further comprising:

means for repeating the performing the plurality of experiments for the integrated circuit chip over a range of frequencies over a range of power distribution system impedances;

means for generating a schmoo diagram for each of the repeated plurality of experiments; and means for analyzing the schmoo diagrams to determine whether the core power distribution system functions are acceptable at a particular frequency.

* * * * *